US008105135B2

United States Patent
Laconto et al.

(10) Patent No.: US 8,105,135 B2
(45) Date of Patent: Jan. 31, 2012

(54) POLISHING SLURRIES

(75) Inventors: Ronald W. Laconto, Leicester, MA (US); Andrew G. Haerle, Sutton, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 747 days.

(21) Appl. No.: 11/541,431

(22) Filed: Sep. 29, 2006

(65) Prior Publication Data

US 2007/0087667 A1   Apr. 19, 2007

Related U.S. Application Data

(60) Provisional application No. 60/722,270, filed on Sep. 30, 2005, provisional application No. 60/755,554, filed on Dec. 30, 2005.

(51) Int. Cl.
*B24D 3/06* (2006.01)

(52) U.S. Cl. ........... 451/559; 51/309; 428/404; 451/36; 451/41

(58) Field of Classification Search ............ 451/41, 451/42, 28, 36, 559; 428/404, 406, 402; 51/307, 309; 106/3
See application file for complete search history.

(56) References Cited

U.S. PATENT DOCUMENTS

| | | | | |
|---|---|---|---|---|
| 5,086,021 A * | 2/1992 | Sasaki et al. | ............... | 501/137 |
| 5,102,769 A * | 4/1992 | Creatura | ............... | 430/137.13 |
| 5,441,549 A * | 8/1995 | Helmin | ............... | 51/298 |
| 5,487,965 A * | 1/1996 | Odell | ............... | 430/137.22 |
| 5,507,850 A * | 4/1996 | Helmin | ............... | 51/298 |
| 5,520,711 A * | 5/1996 | Helmin | ............... | 51/295 |
| 5,521,046 A * | 5/1996 | Materazzi | ............... | 430/115 |
| 5,775,980 A * | 7/1998 | Sasaki et al. | ............... | 451/285 |
| 5,821,214 A * | 10/1998 | Weibel | ............... | 510/368 |
| 5,837,436 A * | 11/1998 | Mihayashi et al. | ............... | 430/503 |
| 5,935,772 A * | 8/1999 | Tamaoki et al. | ............... | 430/501 |
| 6,081,483 A | 6/2000 | Capt et al. | | |
| 6,604,987 B1 | 8/2003 | Sun | | |
| 6,616,717 B2 | 9/2003 | Sachan et al. | | |
| 6,620,214 B2 * | 9/2003 | McArdle et al. | ............... | 51/298 |
| 6,758,727 B2 * | 7/2004 | Coad | ............... | 451/41 |
| 6,794,285 B2 | 9/2004 | Matsui et al. | | |
| 6,818,153 B2 * | 11/2004 | Burnell-Jones | ............... | 252/301.36 |
| 6,821,897 B2 | 11/2004 | Schroeder et al. | | |
| 6,881,483 B2 * | 4/2005 | McArdle et al. | ............... | 428/403 |

(Continued)

FOREIGN PATENT DOCUMENTS

EP   1 350 827 A1   10/2003

(Continued)

OTHER PUBLICATIONS

Heydemann, V.D., et al., "Chemi-Mechanical Polishing of On-Axis Semi-Insulating SiC Substrates," Trans Tech Publications, Switzerland, 2004, 4 pgs.

*Primary Examiner* — Timothy V Eley
(74) *Attorney, Agent, or Firm* — Abel Law Group, LLP

(57) ABSTRACT

A polishing slurry includes liquid medium and particulate abrasive. The particulate abrasive includes soft abrasive particles, hard abrasive particles, and colloidal silica particles, wherein the soft abrasive particles have a Mohs hardness of not greater than 8 and the hard abrasive particles have a Mohs hardness of not less than 8, and wherein the soft abrasive particles and the hard abrasive particles are present at a weight ratio of not less than 2:1.

19 Claims, 4 Drawing Sheets

U.S. PATENT DOCUMENTS

| | | | |
|---|---|---|---|
| 6,896,591 B2 * | 5/2005 | Chaneyalew et al. | 451/41 |
| 2002/0039839 A1 | 4/2002 | Thomas et al. | |
| 2002/0095871 A1 * | 7/2002 | McArdle et al. | 51/298 |
| 2003/0041526 A1 | 3/2003 | Fujii et al. | |
| 2003/0092271 A1 | 5/2003 | Jindal et al. | |
| 2003/0134577 A1 * | 7/2003 | Coad | 451/41 |
| 2003/0171078 A1 * | 9/2003 | Ryoke et al. | 451/41 |
| 2003/0211747 A1 | 11/2003 | Hegde et al. | |
| 2004/0157535 A1 | 8/2004 | Chaneyalew et al. | |
| 2004/0216388 A1 | 11/2004 | Mathur et al. | |
| 2004/0221515 A1 * | 11/2004 | McArdle et al. | 51/308 |
| 2006/0014111 A1 * | 1/2006 | Goto | 430/348 |
| 2006/0065989 A1 * | 3/2006 | Druffel et al. | 264/1.32 |
| 2006/0117667 A1 * | 6/2006 | Siddiqui et al. | 51/309 |

FOREIGN PATENT DOCUMENTS

| | | |
|---|---|---|
| EP | 1518910 A | 3/2005 |
| JP | 60172465 A | 9/1985 |
| JP | 2000336344 A | 12/2000 |
| JP | 2001152133 A | 6/2001 |
| JP | 2004311575 A | 11/2004 |
| JP | 2005236275 A | 9/2005 |
| WO | 02/100963 A | 12/2002 |
| WO | 2004072199 A2 | 8/2004 |

* cited by examiner

POLISHING SLURRIES

CROSS-REFERENCE TO RELATED APPLICATION(S)

The present application claims priority from U.S. Provisional Patent Application No. 60/722,270, filed Sep. 30, 2005, entitled "POLISHING SLURRIES AND METHODS FOR UTILIZING SAME," naming inventors Ronald W. Laconto and Andrew G. Haerle, which application is incorporated by reference herein in its entirety.

The present application claims priority from U.S. Provisional Patent Application No. 60/755,554, filed Dec. 30, 2005, entitled "POLISHING SLURRIES AND METHODS FOR UTILIZING SAME," naming inventors Ronald W. Laconto and Andrew G. Haerle, which application is incorporated by reference herein in its entirety.

BACKGROUND

1. Field of the Disclosure

The present disclosure is generally related to polishing slurries and methods for polishing workpieces or components, and in particular, polishing slurries incorporating a liquid medium and a particulate abrasive and methods for utilizing the same.

2. Description of the Related Art

Across a wide range of industries it is common to machine workpieces or components, including metal and ceramic components as well as composite components. One mature and intensely studied industry area includes the polishing of semiconductor substrates by a process that is known as chemical-mechanical polishing (CMP), in which a slurry is both mechanically and chemically active to remove the deposited materials from a semiconductor substrate. Other art areas have focused purely on mechanical removal, through use of abrasive slurries (also know as free abrasives), containing abrasive particulate material such as diamond, as well as a host of ceramic oxide and non-oxide materials.

Among the many types of ceramic and metal components that are subjected to post-formation machining, components formed of hard ceramic materials such as silicon carbide represent a particular challenge. Such components have found industrial use in a wide array of applications, including structural, refractory, and semiconductor processing components. Due to processing constraints associated with conventional ceramic processing including natural process tolerances, ceramic components such as silicon carbide components oftentimes require post-forming machining in which the components are in a densified form but require surface finishing. Given the hardness of typical ceramic components, it is generally laborious, expensive, and time consuming to effect final stage machining, which oftentimes includes polishing.

In light of the foregoing, many industries continue to seek polishing slurries or free-abrasives and process methodology associated therewith that simultaneously achieve a high material removal rate (MRR), as well as a suitably fine finish, such as low surface roughness and high degree of planarity and surface parallelism. Such needs are particularly acute in the context of ceramic components, particularly including hard ceramics as noted above.

SUMMARY

According to one aspect, a polishing slurry is provided that includes a liquid medium and a particulate abrasive that includes a combination of soft abrasive particles, hard abrasive particles, and colloidal silica particles. The soft abrasive particle may have a Mohs hardness of not greater than 8, and the hard abrasive particles may have a Mohs hardness not less than 8. The soft abrasive particles are typically present in a greater amount than the hard abrasive particles, such as at a weight ratio of 2:1 with respect to the hard abrasive particles.

According to another embodiment, a polishing slurry includes a liquid medium and particulate abrasive, including ceria particles, diamond particles, and colloidal silica particles. The ceria particles form not less than 50 wt % of the particulate abrasive.

According to another aspect, a polishing slurry includes a liquid medium and a particulate abrasive including soft abrasive particles, hard abrasive particles, and colloidal silica particles. The particles are present in respective amounts of x wt %, y wt %, and z wt %, wherein $x+z \geq 2y$.

According to another embodiment, a polishing slurry includes a liquid medium and particulate abrasive including soft and hard abrasive particles, and colloidal silica particles. The hard abrasive particles have a higher Mohs hardness than that of the soft abrasive particles, and at least one of the soft and hard abrasive particles have a positive surface charge, thereby flocculating with the colloidal silica particles.

According to another aspect, a method of polishing a ceramic component is provided, including providing one of the polishing slurries as described above between a ceramic component and machine tool, and moving the ceramic component and machine tool relative to each other to effect material removal form a surface of the ceramic component.

DESCRIPTION OF THE PREFERRED EMBODIMENT(S)

Figure 1:
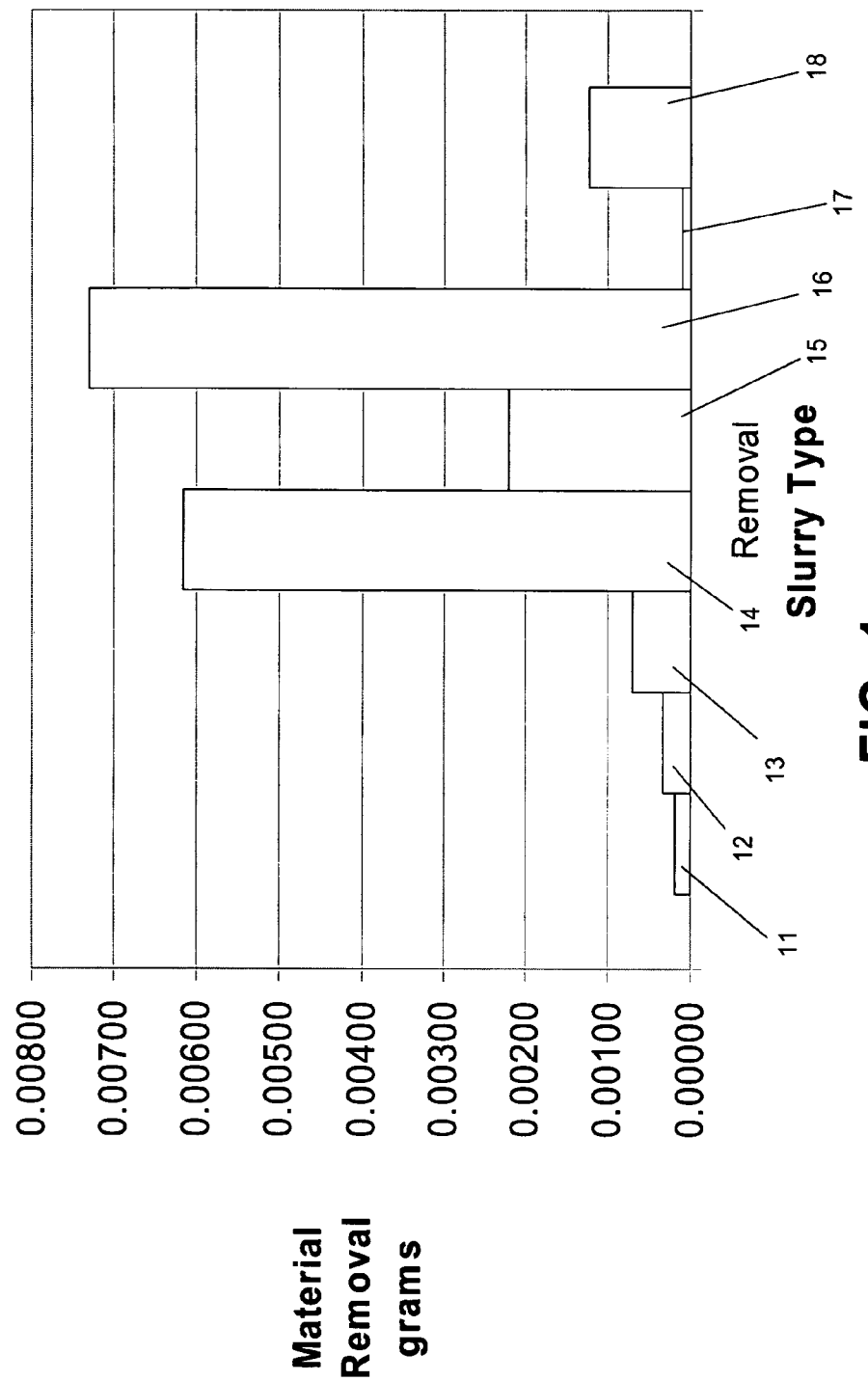
FIGS. 1-4 illustrate polish rates of various slurries on single crystal SiC.

According to one embodiment, a polishing slurry is provided that includes a liquid medium in which a particulate abrasive is provided. The particulate abrasive has generally a composite structure, including several different species of abrasive particles. In one embodiment, the particulate abrasive includes soft abrasive particles, hard abrasive particles, and colloidal silica particles. Generally, the hard abrasive particles have a higher Mohs hardness than the Mohs hardness of the soft abrasive particles. For example, the Mohs hardness of the hard abrasive particles may be not less than 8, such as not less than 9, and indeed may have a hardness of 10. In contrast, the soft abrasive particles may have a hardness not greater then 8, such as not greater then 7, or even not greater than 6. In one particular embodiment, the soft abrasive particles are principally formed of ceria, while the hard abrasive particles are principally formed of diamond. Other hard abrasive particles include boron carbide, silicon carbide, and aluminum oxide.

Embodiments herein utilizing ceria as the soft abrasive particulate material may be considered to form a CMP slurry that is both mechanically and chemically active. Here, the ceria may act as an oxidizer during polishing operations to assist in material removal.

Most often, the particulate abrasive includes a notably higher content of soft abrasive particles relative to hard abrasive particles, such as at a weight ratio of soft:hard particles of not less than 2:1, such as not less than 5:1, 10:1, or even 15:1.

Indeed, certain embodiments have a fairly high loading of soft abrasive particles, such as represented by a weight ratio of not less than about 20:1.

The soft abrasive particles may be present as the majority component in the particulate abrasive, forming not less than 50 weight percent of the particulate abrasive. In other embodiments, the particulate abrasive contains x wt % soft abrasive particles, y wt % hard abrasive particles, and z wt % colloidal silica particles, wherein $x+z \geqq 2y$. For example, certain embodiments may have even higher concentrations of soft abrasive particles and colloidal silica particles relative to the hard abrasive particles, represented by the relationship $x+z \geqq 3y$ or even 5y, 8y, 10y, or even $\geqq 12y$. Indeed, certain embodiments may have even higher loadings of soft abrasive particles and colloidal silica particles relative to the hard abrasive particles, such as represented by a relationship $x+z \geqq 15y$, or even 20y.

Turning to more specific compositional parameters of various polishing slurries according to embodiments herein, the slurry may contain particulate abrasive, which comprises 50-95 wt % soft abrasive particles, 0.5-15 wt % hard abrasive particles, and 4.5-35 wt % colloidal silica. Another embodiment calls for 70-95 wt % soft abrasive particles, 0.5-15 wt % hard abrasive particles, and 4.5-29.5 colloidal silica. In yet another embodiment, the particulate abrasive includes 75-95 wt % soft abrasive particles, 0.5-10 wt % hard abrasive particles, and 4.5-24.5 wt % colloidal silica.

Turning more specifically to the various particles that make up the particulate abrasive, generally the hard abrasive particles are relatively fine, having an average particle size of about 0.02-50 µm, such as 0.05-10 µm, or even within a narrower range of 0.05-1.0 µm. Various commercially available diamond particles may be utilized having average particles sizes within those ranges mentioned herein. Turning to the soft abrasive particle, the particles may have a fairly fine morphology, having a particle size within a range of about 3-800 nm, such as within a range of about 10-300 nm, or even 10-200 nm. As noted above, one of the particular species of soft abrasive particles utilized herein is $CeO_2$ (ceria or cerium oxide).

Turning to the colloidal silica, the term "colloidal" is utilized herein to mean particulate material that is normally dispersed in a liquid medium and which remains dispersed by Brownian Motion absent interaction with other particulate species. That is, as a standalone ingredient for integration into a slurry with other particulate species, the colloidal silica is generally substantially free of agglomeration and may be substantially mono-dispersed. However, the state of dispersion of the colloidal silica may be altered in the context of a ready to use slurry as discussed in more detail below. In one embodiment, the colloidal silica is a solution-formed particulate material, formed from a sol or sol-gel process to form nano-sized particles. The colloidal silica generally has a very fine average particle size, generally sub-micron, and even more typically within a range of about 3-200 nm, such as within a range of about 10-100 nm, or even 10-75 nm.

Typically, the solids loading or percentage of particulate abrasive in the polishing slurry lies within a range of about 2-50 weight percent, such as 2-35 wt %, or 5-25 wt %. The foregoing loading represents the total solids content within the slurry based on the total weight of the slurry including both the solid particulate components and the liquid components. In this respect, the liquid medium may be water (aqueous), organic, or a combination of water and organic species. Typical species for the liquid medium include deionized water, glycerin, and/or TEA.

EXAMPLE

In one example, the following slurry composition was formed.
a. Colloidal Silica: 0.0177 parts by weight
b. Glycerin: 0.2474 parts by weight
c. Water: 0.62277 parts by weight
d. TEA: 0.0032 parts by weight
e. Ceria: 0.1100 parts by weight
f. Diamond: 0.0045 parts weight The total solids loading was about 0.1322 parts or 13.22 wt %, made up of 3.4 wt % diamond, 83 wt % ceria, and 13.4 wt % colloidal silica. The colloidal silica had an average particle size under 100 nm, with particular silicas at about 40 nm and about 50 nm. The ceria had an average particle size below 200 nm, about 165 nm. The diamond had an average particle of about 0.10 µm.

According to yet another aspect of the present invention, methods for machining (particularly including polishing) a ceramic component are provided. According to one method, a polishing slurry is provided between the ceramic component to undergo polishing and a machine tool, and a ceramic component and the machine tool are moved relative to each other to effect material removal from a surface of the ceramic component. Here, the machine tool may be moved relative to a stationary ceramic component, the ceramic component may be moved relative to a stationary machine tool, or both the ceramic component and the machine tool may be moved or translated; nevertheless, in all cases, the two components (ceramic component and machine tool) are moved relative to each other even if one is held stationary. The polishing slurry including a liquid medium and particulate abrasive may be any one of the various slurry embodiments mentioned above. As to the particular architecture of the polishing operation, any one of various polishing apparatuses may be utilized, commonly available in the art. The machine tool may be embodied as a polishing pad, a plurality of polishing pads, or a continuous belt, for example. The machine tool is generally biased against the ceramic component with the slurry provided there between. The machine tool may even be embodied as a fixed abrasive, such as a coated abrasive or bonded abrasive, although typically the machine tool is not itself an abrasive component, since slurries as disclosed herein have a particularly engineered composite particulate abrasive structure as already discussed in detail above.

The present inventors have discovered that according to various embodiments of the present invention, particularly including a composite particulate abrasive as detailed herein, provide desirable performance in terms of material removal rate and surface finish. Various embodiments have demonstrated material removal rates not less than about 0.5 µm/hr, such as not less than about 1.0 µm/hr, and even not less than 1.25 µm/hr. Indeed, specific polishing runs have provided a material removal rate (MRR) of about 1.5 µm/hr. In addition, desirable surface finishes have been demonstrated according to embodiments of the present invention, having a surface roughness rms not greater than 100 Å, such as not greater than 50 Å, 20 Å, and even not greater than 10 Å. Indeed, polishing runs according to examples herein have shown a surface roughness of about 4 to 5 Å rms.

In contrast, comparative examples were created which did not contain all three of a soft abrasive particulate component (e.g., ceria), a hard abrasive particulate component (e.g., diamond), and colloidal silica. In each of these comparative examples, material removal rates were quite low. For example, a slurry containing diamond and colloidal silica, and a slurry containing ceria and colloidal silica were found to have a material removal rate a full order of magnitude lower than examples according to embodiments herein, generally on the order of 0.2 μm/hr, under identical processing conditions.

Without wishing to be tied to any particular theory, it is believed that the colloidal silica as utilized herein has a negative charge on its surface, thereby causing slight flocculation due to interaction with positively charged soft abrasive particles, such as the ceria particles. The flocculation is believed to cause the formation of soft agglomerates that contain a distribution (in a minor amount) of the hard abrasive particles (e.g., diamond). It is believed that perhaps the diamond particles are exposed along an outer surface of the agglomerates, the agglomerates combining the properties of large soft particles (to reduce scratching) and hard particles (to achieve high MRR).

As used herein, description of flocculation to form agglomerates is notably distinct from formation of hard abrasive aggregates, such as those aggregates disclosed in U.S. Pat. No. 6,081,483. Here, the term "agglomerate," refers to weakly bonded mass of particles, wherein each of the constituent species of particles is still individually identifiable in the agglomerate and are not strongly bonded together, as opposed to bonded aggregates, which aggregates are composed of covalently bonded particles typically formed through heat treatment, and in which one of the species may no longer be in particulate form (e.g., colloidal silica forming a non-particulate bonding layer). According to embodiments herein, the colloidal silica generally remains in particulate form, although the colloidal silica may be agglomerated with the other species of the abrasive particulate in the slurry. Also, generally embodiments are essentially free of aggregates that contain the hard species (e.g., diamond), the soft species (e.g., ceria) and the colloidal silica.

ADDITIONAL EXAMPLES

Turning to the FIGS. 1-4, various slurries 11-42 were created and evaluated under identical process conditions on a single crystal silicon carbide workpiece mounted in a Strasbaugh 6CA polishing tool. A description of the slurries is provided below in the Table.

TABLE

| Slurry | pH | Machine: Strasbaugh 6CA Description | Weight Removal |
|---|---|---|---|
| 11 | 12 | CERIA ONLY | 0.00020 |
| 12 | 12 | SILICA ONLY | 0.00033 |
| 13 | 12 | CERIA/SILICA | 0.00070 |
| 14 | 12 | CER/D/CS1 | 0.00617 |
| 15 | 12 | D/CS1/50 ct/L | 0.00220 |
| 16 | 12 | CER/D/CS1 | 0.00730 |
| 17 | 12 | CER/CS1 | 0.00010 |
| 18 | 12 | Al2O3/D/CS2 | 0.00123 |
| 41 | 9 | pH9 CER-D CS1 | 0.00220 |
| 42 | 12 | pH12 CER-D CS1 | 0.00637 |
| 31 | 12 | CER/D/CS1/std | 0.00730 |
| 32 | 12 | CER/D/CS1/50 ct/L | 0.00840 |
| 33 | 12 | CER/D/CS1/25 ct/L | 0.00643 |
| 34 | 12 | CER/D/CS1/100 ct/L | 0.00325 |
| 35 | 12 | CER/D/CS1/100 ct/L | 0.00627 |
| 21 | 12 | CER/D/CS1/std | 0.00730 |
| 22 | 12 | CER/D/no Silica/25 ct | 0.00287 |
| 23 | 12 | CER/D/NoGLYC/25 ct | 0.00833 |
| 24 | 12 | CER/D/noTEA/25 ct | 0.00830 |
| 25 | 12 | CER/D/CS2/25 ct | 0.00513 |
| 26 | 12 | 9240/D/CS2 | 0.00123 |

As used above, CER represents ceria, D represents diamond, CS1 is a first colloidal silica-based additive (provided in the form of a suspension), and CS2 is a second colloidal silica-based additive (also provided in the form of a suspension).

FIG. 1 shows that notable improvements in polishing rates can be achieved through the combination of colloidal silica, a hard abrasive (in this case, diamond), and a positively charged soft abrasive (in this case, ceria). Noteworthy, the polishing rates of the three component system were far in excess of polishing rates of slurries having only one or two of the components, and Slurry 18 shows that a negatively charged material such as alumina is not particularly effective as compared to use of a positively charged material such as ceria.

Figure 2:
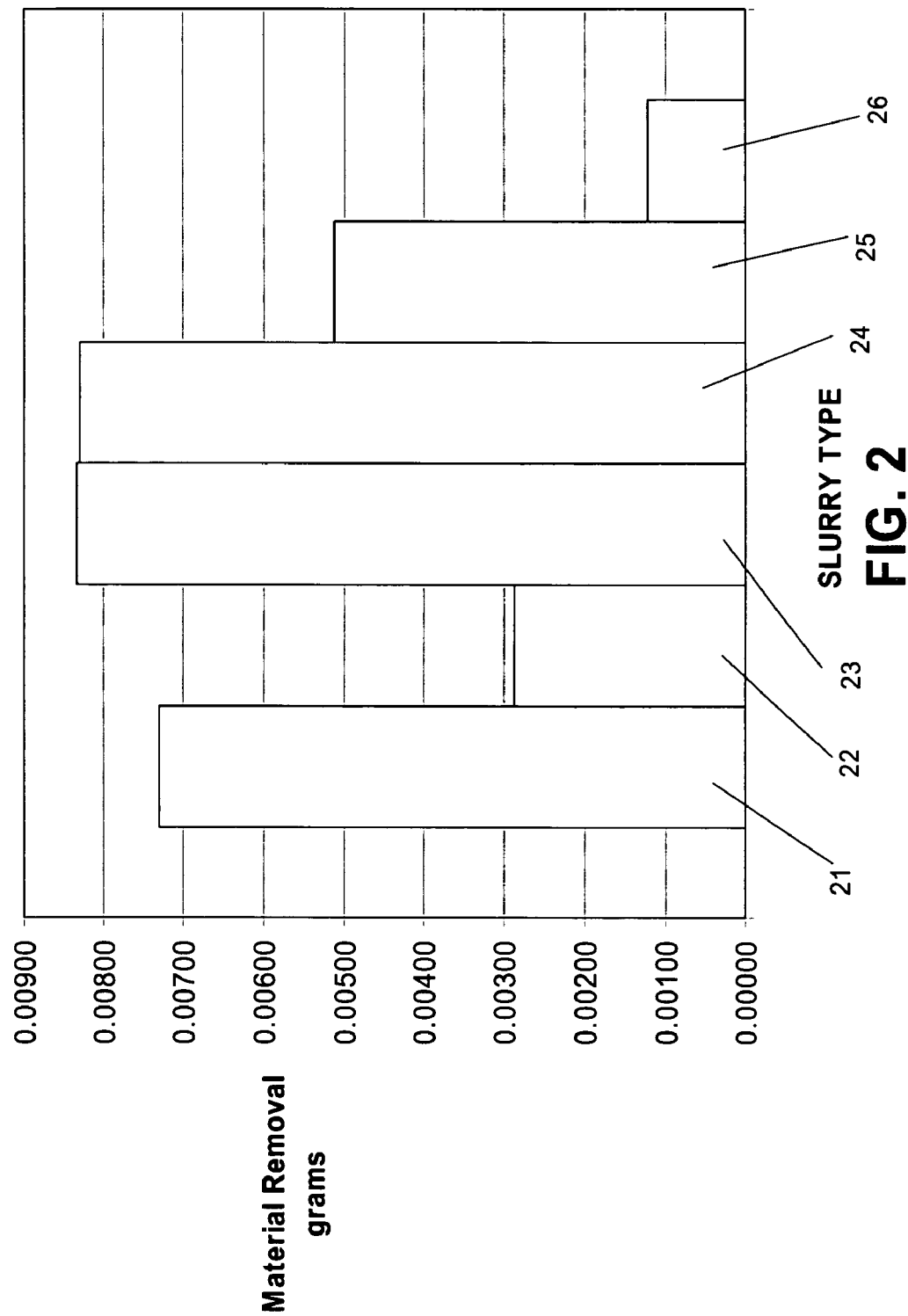

FIG. 2 shows that the active ingredient in the silica-containing suspensions CS1 and CS2 is indeed the silica. See particularly Slurry 22, containing a silica-free suspension.

Figure 3:
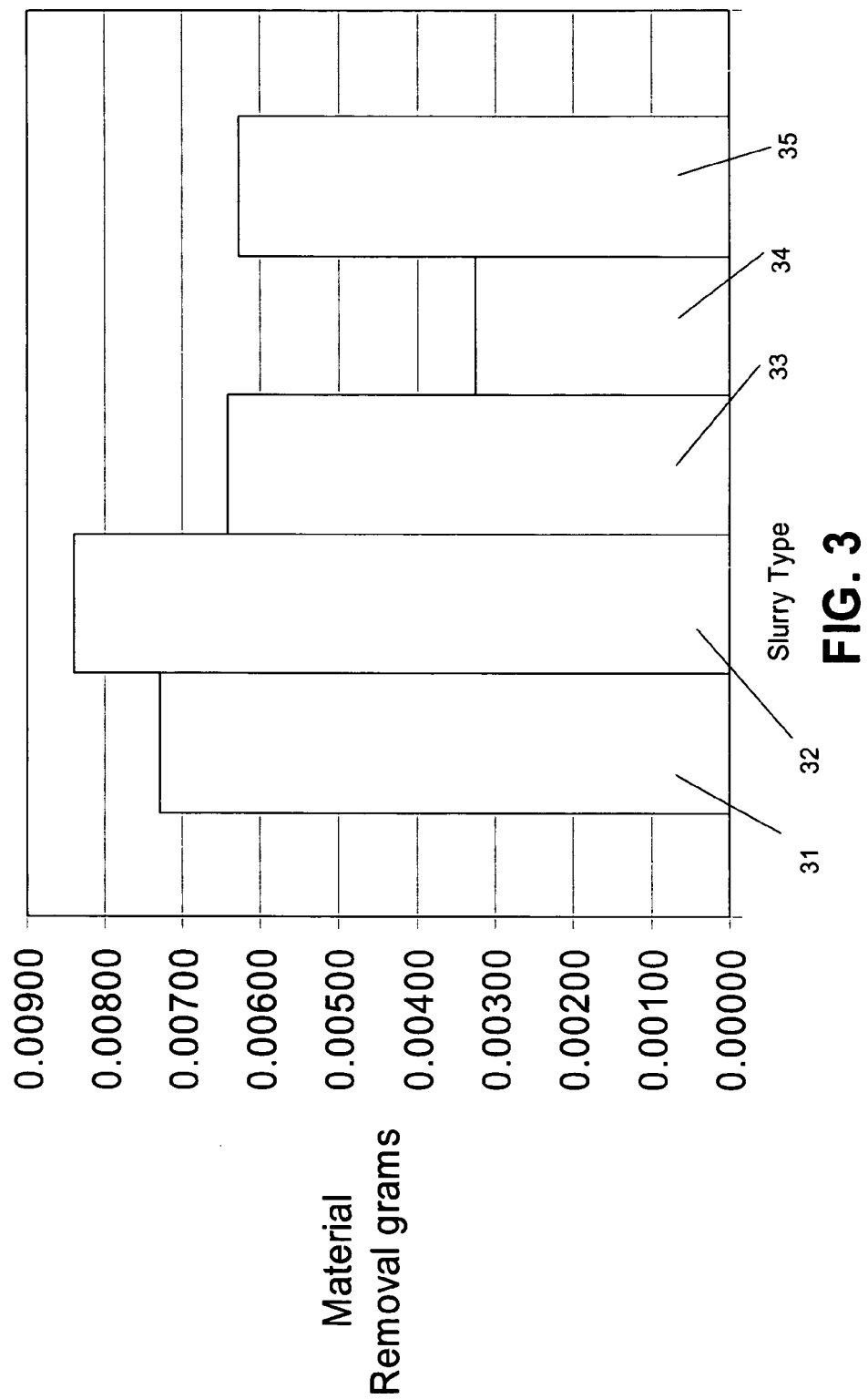

FIG. 3 shows that higher concentrations of diamond in the slurry were of limited effectiveness.

Figure 4:
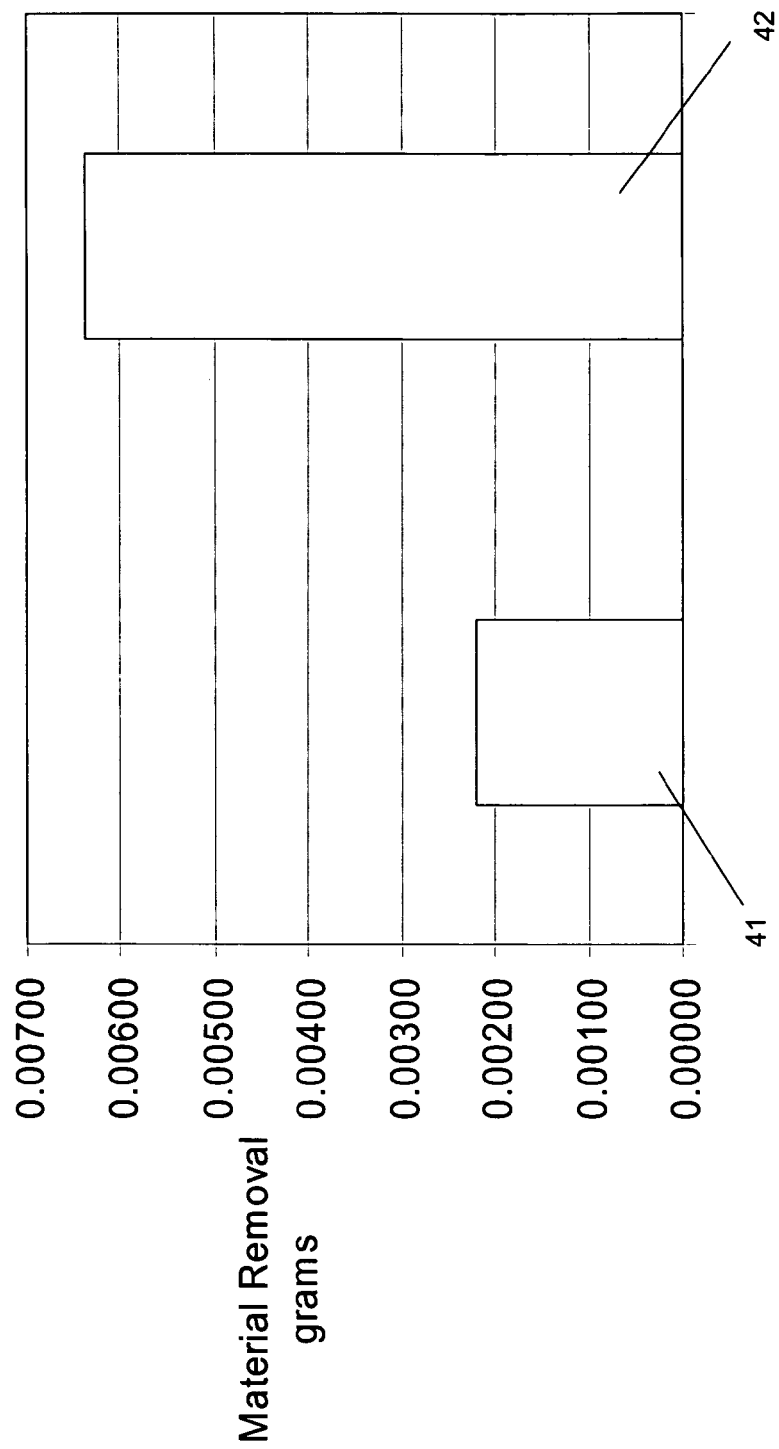

FIG. 4 shows that higher pH improves polishing rates, with a notably superior polishing rate at a pH of 12 as compared to pH of 9.

While embodiments of the invention have been illustrated and described with particularity, the invention is not intended to be limited to the details shown, since various modifications and substitutions can be made without departing in any way from the scope of the present invention. For example, additional or equivalent substituents can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A polishing slurry comprising:
   liquid medium; and
   particulate abrasive comprising soft abrasive particles, hard abrasive particles, and colloidal silica particles, wherein the soft abrasive particles have a positive surface charge and have a Mohs hardness of not greater than 6 and the hard abrasive particles have a Mohs hardness of not less than 9, and wherein the soft abrasive particles and the hard abrasive particles are present at a weight ratio of not less than 2:1,
   wherein the slurry has a basic pH and is at least partially flocculated, having soft agglomerates containing the soft abrasive particles, hard abrasive particles, and colloidal silica particles.

2. The polishing slurry of claim 1, wherein the soft abrasive particles comprise ceria.

3. The polishing slurry of claim 1, wherein the hard abrasive particles comprise diamond.

4. The polishing slurry of claim 1, wherein the soft abrasive particles and the hard abrasive particles are present at a weight ratio of not less than 5:1.

5. The polishing slurry of claim 4, wherein the soft abrasive particles and the hard abrasive particles are present at a weight ratio of not less than 10:1.

6. The polishing slurry of claim 1, wherein the particulate abrasive comprises 50 to 95 wt % soft abrasive particles, 0.5 to 15 wt % hard abrasive particles and 4.5 to 35 wt % colloidal silica particles.

7. The polishing slurry of claim 6, wherein the particulate abrasive comprises 70 to 95 wt % soft abrasive particles, 0.5 to 15 wt % hard abrasive particles and 4.5 to 29.5 wt % colloidal silica particles.

8. The polishing slurry of claim 1, wherein the average particle size of the colloidal silica particles is within a range of about 3 to 200 nm.

9. The polishing slurry of claim 1, wherein the hard abrasive particles have an average particle size within a range of about 0.02 to 50 μm.

10. The polishing slurry of claim 1, wherein the slurry is essentially free of aggregates containing the soft abrasive particles, the hard abrasive particles, and the colloidal silica particles.

11. The polishing slurry of claim 1, wherein the slurry has a pH of 12 or higher.

12. The polishing slurry of claim 1, wherein the agglomerates have not undergone heat treatment or curing.

13. A polishing slurry comprising:
  liquid medium; and
  particulate abrasive comprising ceria particles, diamond particles, and colloidal silica particles, wherein the ceria particles have a positive surface charge and form not less than 50 wt % of the particulate abrasive,
  wherein the slurry has a pH of 9 or higher and is at least partially flocculated, having soft agglomerates containing the ceria particles, diamond particles, and colloidal silica particles.

14. The polishing slurry of claim 13, wherein the ceria particles and the diamond particles are present at a weight ratio of not less than 10:1.

15. The polishing slurry of claim 13, wherein colloidal silica particles are present in an amount effective to at least partially flocculate the slurry.

16. The polishing slurry of claim 13, wherein the particulate abrasive comprises 50 to 95 wt % ceria particles, 0.5 to 15 wt % diamond particles and 4.5 to 35 wt % colloidal silica particles.

17. The polishing slurry of claim 13, wherein the average particle size of the colloidal silica particles is within a range of about 3 to 200 nm.

18. A polishing slurry comprising:
  liquid medium; and
  particulate abrasive comprising soft abrasive particles having a positive surface charge and present in an amount of x wt % of the particulate abrasive, hard abrasive particles present in an amount of y wt % of the particulate abrasive, and colloidal silica particles present in an amount of z wt % of the particulate abrasive, wherein the hard abrasive particles have a Mohs hardness greater than the Mohs hardness of the soft abrasive particles, and wherein $x+z>2y$,
  wherein the slurry has a pH of 9 or higher and is at least partially flocculated, having soft agglomerates containing the soft abrasive, hard abrasive, and colloidal silica particles, the soft abrasive particles, hard abrasive particles, and colloidal silica particles being weakly bonded together, and free of covalent bonding therebetween.

19. The polishing slurry of claim 18, wherein $x+z>8y$.

* * * * *

UNITED STATES PATENT AND TRADEMARK OFFICE
CERTIFICATE OF CORRECTION

| | | |
|---|---|---|
| PATENT NO. | : 8,105,135 B2 | Page 1 of 1 |
| APPLICATION NO. | : 11/541431 | |
| DATED | : January 31, 2012 | |
| INVENTOR(S) | : Ronald W. Laconto et al. | |

It is certified that error appears in the above-identified patent and that said Letters Patent is hereby corrected as shown below:

In the Claims

Col. 8, line 27, claim 19, please delete "$x+z>8y$," and insert -- $x+z\geq 8y$. --.

Signed and Sealed this
Twenty-third Day of September, 2014

Michelle K. Lee
*Deputy Director of the United States Patent and Trademark Office*